(12) United States Patent
Joshi et al.

(10) Patent No.: US 7,723,781 B2
(45) Date of Patent: *May 25, 2010

(54) VERTICAL THIN-FILM TRANSISTOR WITH ENHANCED GATE OXIDE

(75) Inventors: Pooran Chandra Joshi, Vancouver, WA (US); Apostolos T. Voutsas, Vancouver, WA (US); John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 23 days.

This patent is subject to a terminal disclaimer.

(21) Appl. No.: 12/108,333

(22) Filed: Apr. 23, 2008

(65) Prior Publication Data

US 2008/0224205 A1    Sep. 18, 2008

Related U.S. Application Data

(60) Division of application No. 11/139,726, filed on May 26, 2005, now Pat. No. 7,381,595, which is a continuation-in-part of application No. 10/871,939, filed on Jun. 17, 2004, now Pat. No. 7,186,663, and a continuation-in-part of application No. 10/831,424, filed on Apr. 23, 2004, now Pat. No. 6,995,053, and a continuation-in-part of application No. 10/801,374, filed on Mar. 15, 2004, now Pat. No. 7,087,537.

(51) Int. Cl.
*H01L 29/78* (2006.01)

(52) U.S. Cl. .............................. 257/329; 257/E27.056; 257/E27.057

(58) Field of Classification Search .................. 257/135, 257/302, 328, 329, 347, E27.055, E27.057, 257/E27.056
See application file for complete search history.

(56) References Cited

U.S. PATENT DOCUMENTS

| 4,980,732 A | * | 12/1990 | Okazawa | ..................... 257/369 |
| 5,173,754 A | * | 12/1992 | Manning | ..................... 257/69 |
| 7,265,393 B2 | * | 9/2007 | Schuele et al. | ............... 257/135 |
| 2003/0062574 A1 | * | 4/2003 | Hsieh | .......................... 257/379 |

* cited by examiner

*Primary Examiner*—Brook Kebede
(74) *Attorney, Agent, or Firm*—Law Office of Gerald Maliszewski; Gerald Maliszewski

(57) ABSTRACT

A method is provided for forming a low-temperature vertical gate insulator in a vertical thin-film transistor (V-TFT) fabrication process. The method comprises: forming a gate, having vertical sidewalls and a top surface, overlying a substrate insulation layer; depositing a silicon oxide thin-film gate insulator overlying the gate; plasma oxidizing the gate insulator at a temperature of less than 400° C., using a high-density plasma source; forming a first source/drain region overlying the gate top surface; forming a second source/drain region overlying the substrate insulation layer, adjacent a first gate sidewall; and, forming a channel region overlying the first gate sidewall, in the gate insulator interposed between the first and second source/drain regions. When the silicon oxide thin-film gate insulator is deposited overlying the gate a Si oxide layer, a low temperature deposition process can be used, so that a step-coverage of greater than 65% can be obtained.

7 Claims, 6 Drawing Sheets

VERTICAL THIN-FILM TRANSISTOR WITH ENHANCED GATE OXIDE

RELATED APPLICATIONS

This application is a Divisional of a pending patent application entitled, HIGH-DENSITY PLASMA OXIDATION FOR ENHANCED GATE OXIDE PERFORMANCE, invented by Pooran Joshi et al., Ser. No. 11/139,726, filed May 26, 2005, now U.S. Pat. No. 7,381,595 which is a Continuation-in-Part of the following applications:

HIGH-DENSITY PLASMA PROCESS FOR SILICON THIN-FILMS, invented by Pooran Joshi, Ser. No. 10/871,939, filed Jun. 17, 2004, now U.S. Pat. No. 7,186,663;

METHODS FOR FABRICATING OXIDE THIN-FILMS, invented by Joshi et al., Ser. No. 10/801,374, filed Mar. 15, 2004, now U.S. Pat. No. 7,087,537; and, VERTICAL THIN-FILM TRANSISTOR, invented by Schuele et al., Ser. No. 10/831,424, filed Apr. 23, 2004, now U.S. Pat. No. 6,995,053. These applications, and their parent applications, are incorporated herein by reference.

BACKGROUND OF THE INVENTION

1. Field of the Invention

This invention generally relates to the fabrication of integrated circuit (IC) devices, and more particularly, to a gate oxide and a method for forming the same using high-density plasma oxidation.

2. Description of the Related Art

The quality of polysilicon thin-films and the interface between silicon and silicon dioxide ($Si/SiO_2$) layers are critical to the performance of thin-film transistors, MOS capacitors, and various ICs. The quality of the $SiO_2/Si$ interface is dependent upon the quality of the $SiO_x$ (where x is less than, or equal to 2) transition layer at the interface and the defects in the poly-Si layer. The general approach is to improve the quality of the $SiO_x$ transition layer at the $Si/SiO_2$ interface. Defects in the poly-Si can also be passivated and the stoichiometry improved by oxidation and hydrogenation processes.

Although lower temperatures are generally desirable for any device fabrication process, they are especially critical in LCD manufacture, where large-scale devices are formed on a transparent glass, quartz, or plastic substrate. These transparent substrates can be damaged when exposed to temperatures exceeding 650 degrees C. To address this temperature issue, low-temperature Si oxidation processes have been developed. These processes use a high-density plasma source such as an inductively coupled plasma (ICP) source, and are able to form Si oxide with a quality comparable to 1200 degree C. thermal oxidation methods.

Various semiconductor devices require the deposition of $SiO_2$, or other oxide thin-films, on structures that are planar or non-planar. For planar surfaces there is usually no problem in depositing uniform $SiO_2$ thin-films over large areas in the fabrication of stable and reliable devices. However, for a device with vertical steps in the structure, such as shallow-trench isolation (STI), vertical thin-film transistors (V-TFTs), graded steps, or curved surfaces, it is important to deposit $SiO_2$ films with sufficient step-coverage to maintain film integrity, device performance, and yield. Thermal oxide has proven to be the most suitable oxide from the step-coverage point of view. However, the low growth rates and high processing temperatures exceeding 800° C. make thermal oxidation unsuitable for low-temperature devices.

Plasma-enhanced chemical vapor deposition (PECVD) processes are suitable for the low temperature processing of the $SiO_2$ thin-films. The electrical quality and the step-coverage of the PECVD deposited oxide thin-film is strongly dependent upon the processing conditions. It is possible to improve the step-coverage of the deposited oxide by decreasing the process temperature or varying the process chemistries and plasma process variables. However, any such attempt to improve the step-coverage results in a corresponding decrease in the oxide quality.

Low-temperature Si oxide deposition processes are also used to fabricate stepped structures, such as an interlevel interconnect via. Although step-coverage is improved by lowering the process temperatures, the quality of the resultant Si oxide is poor. Thus, good Si oxide step-coverage can conventionally be obtained in non-critical areas of an IC structure, such as a field oxide region for example. However, vertical thin-film transistors (V-TFTs) for example, requiring both a high quality Si gate oxide film and good step-coverage, have been difficult to fabricate.

Generally, a fixed oxide charge is a positive charge that remains after annealing out interface trap charges, and is caused as a result of a structural defect. These fixed oxide charges occur primarily within 2 nanometers of a Si/SiO2 interface. The charge density is dependent upon oxidation and hydrogenation processes. It is known that these fixed oxide charges can be minimized through the use of high oxidation temperatures. Fixed oxide charges in a gate oxide layer can act to degrade the threshold voltage of a transistor.

Oxide trapped charges can be formed at the interface between a silicon layer and a metal or Si substrate, or can be introduced throughout the oxide layer as a result of ion implantation. Mobile ionic charges can also be formed at the silicon oxide interface as a result of ionized alkali metals, sodium, or potassium. A gate insulator with any of the above-mentioned oxide charge types can degrade the threshold voltage, breakdown voltage, and current gain of a transistor.

It would be advantageous if a process could be developed to enhance $Si/SiO_2$ interfaces at a significantly lower thermal budget and temperature.

It would be advantageous if a low-temperature process could be developed that permitted the fabrication of step-covered Si oxide gate insulators.

It would be advantageous if the above-mentioned low-temperature process could reduce the oxide charge concentration in a gate insulator.

SUMMARY OF THE INVENTION

The present invention describes a high-density plasma oxidation process to improve the bulk and interfacial quality of Si oxide thin-films deposited on planar, stepped, graded, or curved surfaces. High-density plasma generated oxide radicals promote efficient oxidation of the oxide thin-films at significantly lower thermal budgets than the thermal or conventional plasma oxidation processes. In this manner, good oxide step-coverage is achieved simultaneously with good oxide quality and reliability.

More specifically, the present invention describes a low temperature (<400° C.) high-density plasma oxidation process to improve the oxidation state of oxide thin-films. The oxidation state, and oxygen vacancies or defects are the major source of poor electrical performance of oxide or sub-oxide thin-films. The conventional approach to improve the oxidation state of oxide thin-films is to expose them to an oxygen atmosphere at elevated temperatures. However as mentioned above, the thermal oxidation process is not suitable for low temperature devices due to high temperatures and large thermal budgets. Likewise, conventional PECVD processes can be used to improve the oxidation state of deposited oxides. However, the conventional capacitively coupled plasma-based processes have high thermal budgets due to low plasma concentration and energy. Structural damage can occur as a result of attempting to enhance the reaction kinetics by increasing the plasma power, which results in a corresponding increase in the sheath potential.

The present invention plasma oxidation process further addresses the issue of step-coverage for V-TFT devices, which require high step-coverage oxide processes to obtain uniform deposition on the top and side faces, which are perpendicular to each other. The step-coverage of conventional PECVD processes depends on the nature of precursor, process temperatures, and the plasma processing conditions. In general, any conventional attempt to improve the step-coverage results in a degradation of the electrical performance. The present invention post-deposition high-density plasma oxidation process enhances the bulk and interfacial quality of the oxide thin-film, even though the film has been deposited at low temperatures to achieve high step-coverage on graded or abrupt transition surfaces.

Accordingly, a method is provided for forming a low-temperature vertical gate insulator in a vertical thin-film transistor (V-TFT) fabrication process. The method comprises: forming a gate, having vertical sidewalls and a top surface, overlying a substrate insulation layer; depositing a silicon oxide thin-film gate insulator overlying the gate; plasma oxidizing the gate insulator at a temperature of less than 400° C., using a high-density plasma source; forming a first source/drain region overlying the gate top surface; forming a second source/drain region overlying the substrate insulation layer, adjacent a first gate sidewall; and, forming a channel region overlying the first gate sidewall, in the gate insulator interposed between the first and second source/drain regions.

When the silicon oxide thin-film gate insulator is deposited overlying the gate, a low temperature deposition process can be used, so that a step-coverage of greater than 65% can be obtained (comparing the gate top surface to gate sidewalls). These results can be obtained for Si oxide thin-film thicknesses of less than 50 nanometers (nm). For example, the Si oxide thin-film can be deposited using a PECVD process with tetraethylorthosilicate (TEOS) precursors.

Another benefit of the high-density plasma oxidation process is a decrease in the concentration of oxide charge in the gate insulation layer. Given a Si oxide thin-film with a thickness in the range of about 10 to 50 nm, an oxide charge concentration of less than $5 \times 10^{11}$ per square centimeter ($cm^{-2}$) can be obtained.

Additional details of the above-described method, a method for forming Si oxide thin-films on substrates with abrupt transitions, and V-TFT devices are presented below.

DETAILED DESCRIPTION

Figure 1:
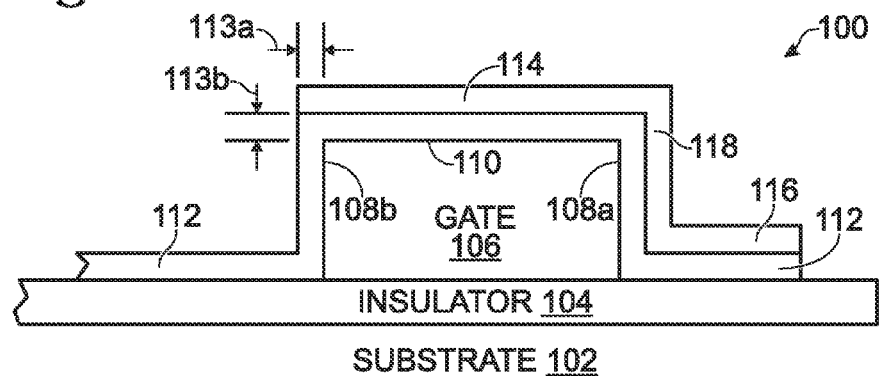
FIG. 1 is a partial cross-sectional view of a vertical thin-film transistor (V-TFT) device.

FIG. 1 is a partial cross-sectional view of a vertical thin-film transistor (V-TFT) device. The V-TFT 100 comprises a substrate 102 and a substrate insulation layer 104 overlying the substrate 102. Generally, the substrate 102 can be a material such as glass, silicon, or plastic. The substrate 102 can also be a temperature-sensitive transparent glass, quartz, or plastic material.

A gate 106, having vertical sidewalls 108 and a top surface 110, overlies the substrate insulation layer 104. A silicon oxide thin-film gate insulator 112 overlies the gate top surface 110 and sidewalls 108. The gate insulator 112 has a step-coverage of greater than 65%. Step-coverage is defined as the ratio of a vertical aspect thickness 113a, to a planar (horizontal) thickness 113b. As shown, the oxide thickness 113a over the sidewalls 108 is being compared to the oxide thickness 113b over the gate top surface 110. Poor step-coverage results in a relatively thin layer of oxide overlying corner and abrupt transition regions. If used as a gate oxide, these "thin" regions are prone breakdown. Thus, step-coverage is an important consideration in the fabrication of V-TFTs, or any active device using an oxide-covered abrupt transition surfaces.

A first source/drain region 114 overlies the gate top surface 110. A second source/drain (S/D) region 116 overlies the substrate insulation layer 104, adjacent a first gate sidewall 108a. A channel region 118 overlies the first gate sidewall 108a, interposed between the first S/D region 114 and the second source/drain region 116.

Note, although the sidewalls 108 have been described as vertical with respect the horizontal surface of the substrate 102, in other aspects not shown, the sidewalls can be graded or curved. That is, the sidewalls 108 need not be perpendicular to the substrate surface. Although not specifically shown in the figure, additional layers of insulator may be used to separate gate top surface 110 from the first S/D region 114.

Figure 2:
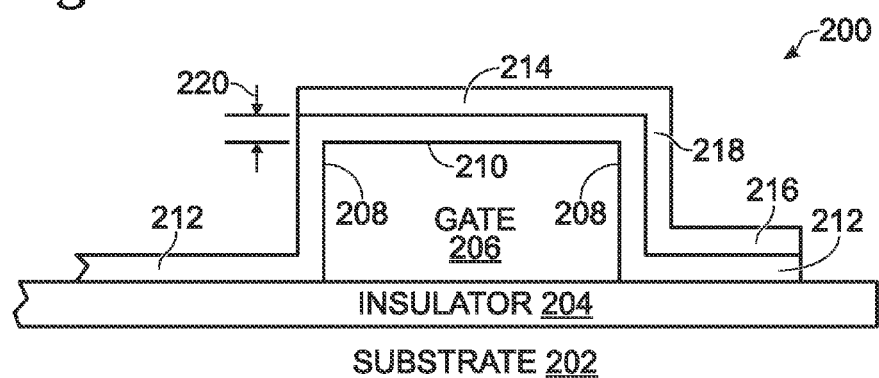
FIG. 2 is a partial cross-sectional view of a V-TFT device variation.

FIG. 2 is a partial cross-sectional view of a V-TFT device variation. The V-TFT 200 comprises a substrate 202 and a substrate insulation layer 204 overlying the substrate 202. Generally, the substrate 102 can be a material such as glass, silicon, and plastic. The substrate 102 can also be a temperature-sensitive transparent glass, quartz, or plastic material.

A gate 206, having vertical sidewalls 208 and a top surface 210, overlies the substrate insulation layer 204. A silicon oxide thin-film gate insulator 212 overlies the gate top surface 210 and sidewalls 208.

A first source/drain region 214 overlies the gate top surface 210. A second source/drain (S/D) region 216 overlies the substrate insulation layer 204, adjacent a first gate sidewall 208a. A channel region 218 overlies the first gate sidewall 208a, interposed between the first S/D region 214 and the second source/drain region 216.

The silicon oxide thin-film gate insulator 212 has a thickness 220 in the range of about 10 to 50 nm and an oxide charge concentration of less than $5\times10^{11}$ per square centimeter ($cm^{-2}$). As used herein, oxide charge concentration refers to the combination of oxide fixed charges, oxide trapped charges, and mobile (ionic) charges. Since perfect step-coverage is difficult to achieve, the thickness 220 is being defined with respect to oxide 212 overlying the gate top surface 210, which is potentially thicker than the Si oxide overlying the sidewalls 208.

As in FIG. 1, the sidewalls 208 have been described as vertical with respect the horizontal surface of the substrate 202, however in other aspects not shown, the sidewalls can be graded or curved. That is, the sidewalls 208 need not be perpendicular to the substrate surface. Although not specifically shown in the figure, additional layers of insulator may be used to separate gate top surface 210 from the first S/D region 214.

Figure 3:
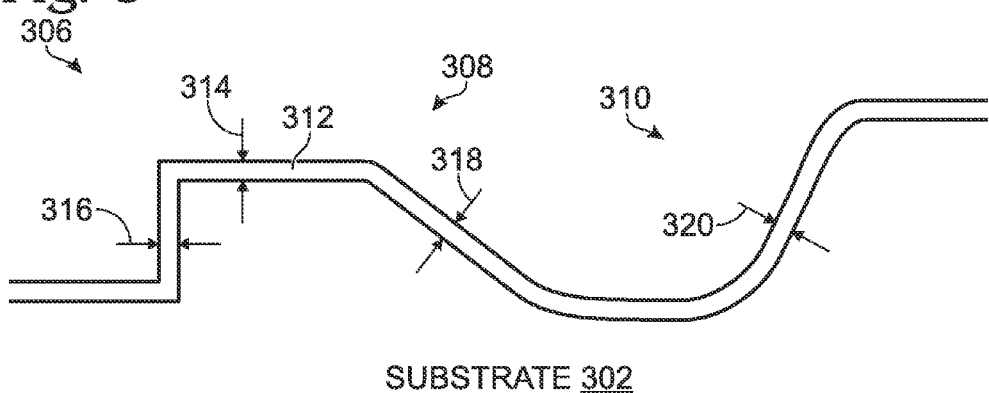
FIG. 3 is a partial cross-sectional view of a silicon oxide thin-film structure formed overlying an abrupt transition surface.

FIG. 3 is a partial cross-sectional view of a silicon oxide thin-film structure formed overlying an abrupt transition surface. The structure 300 comprises a substrate 302 having a surface 304 with an abrupt transition. The substrate 302 can be a material such as Si, silicon oxide, glass, plastic, or quartz, to name a few examples. Shown are a step 306, a grade 308, and a curved surface 310. A silicon oxide thin-film 312 overlies the surface 304 having a thickness 314 in the range of about 10 to 50 nm. The silicon oxide 312 has an oxide charge concentration of less than $5\times10^{11}$ $cm^{-2}$, and a step-coverage of greater than 65%. The step-coverage is defined as the ratio of the silicon oxide over the abrupt transition surface, as compared to a planar surface. With respect to step 306, the step-coverage is defined as the ratio 316/314. With respect to the graded surface 308, the step-coverage is the ratio 318/314. With respect to the curved surface 310, the step-coverage is the ratio 320/314.

Functional Description

The invention describes a novel high-density plasma oxidation process, employing an inductively coupled plasma source, for the post-deposition oxidation of oxide thin-films at process temperatures lower than 400° C. The high-density plasma process is effective in the efficient generation of oxygen radicals to effectively improve the oxidation state of an oxide film, enhancing its electrical performance.

High-Density Plasma System

Figure 4:
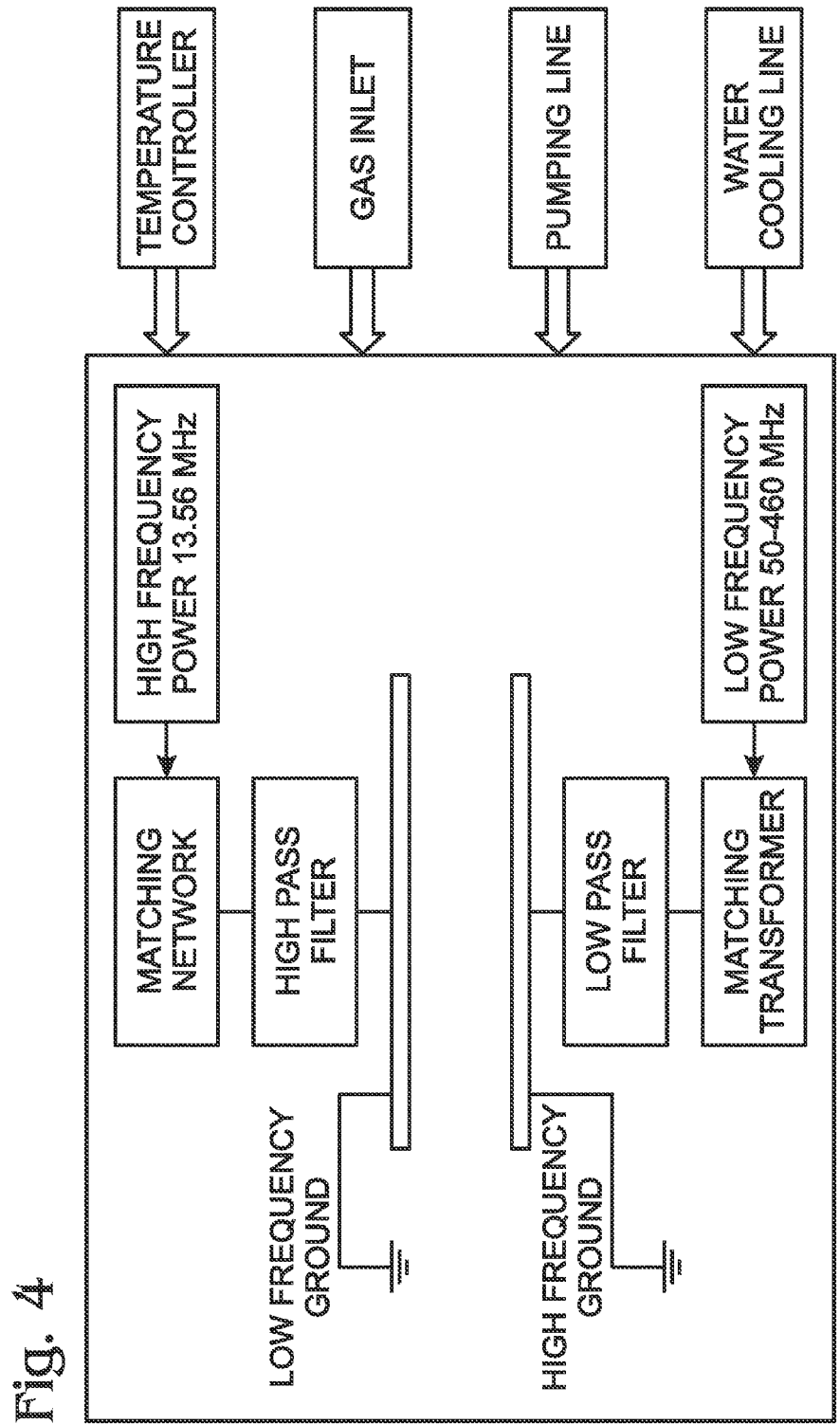
FIG. 4 is a schematic drawing of a high-density plasma system with an inductively coupled plasma source.

FIG. 4 is a schematic drawing of a high-density plasma system with an inductively coupled plasma source. The top electrode is driven by a high frequency radio frequency (RF) source, while the bottom electrode is driven by a low frequency power source. The RF power is coupled to the top electrode through a high-density inductively coupled plasma (ICP) source through a matching network. The bottom electrode power can be varied independently of the top electrode. The top electrode power can be in the range of 13.56-300 megahertz (MHz) depending on the ICP design. The bottom electrode power can be varied in the range of 50 kilohertz (KHz)-13.56 MHz. The pressure can be varied up to 500 mTorr. The top electrode power can be as great as 10 watts (W)/$cm^2$, while the bottom electrode power can be as great as 3 W/$cm^2$.

The HD plasma oxidation processes are effective in minimizing impurities incorporated in the films during deposition at low processing temperatures, as well as impurity-related bonds in the films. This is possible because plasma density and energy levels are higher for the HD-PECVD process than those for conventional PECVD processes.

High-Density Plasma Oxidation Process

The high-density plasma oxidation process described in this invention has been successfully used for the low temperature oxidation of Si films. Further, a high-density plasma growth process, with high $SiO_2$ growth rates at temperatures lower than 400° C., can be used where conventional thermal growth is impractical. The plasma-grown $SiO_2$ thin-films (grown at 350° C.) have a high quality, comparable to thermal oxides grown at temperatures of higher than 800° C.

Figure 5:
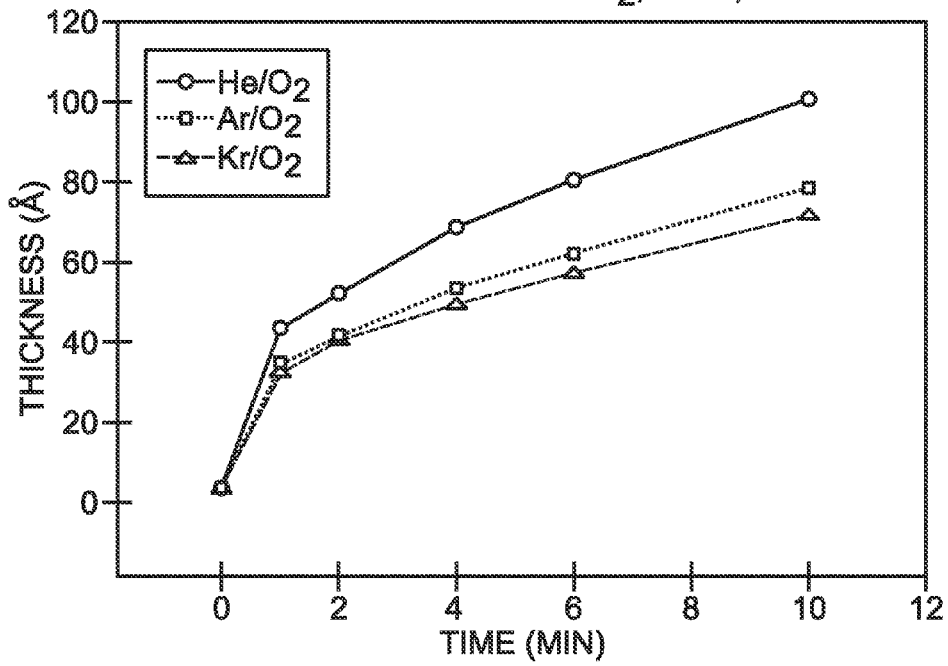
FIG. 5 is a graph depicting some exemplary high-density plasma growth rates in various inert gas/$O_2$ atmospheres.

FIG. 5 is a graph depicting some exemplary high-density plasma growth rates in various inert gas/$O_2$ atmospheres. The high-density plasma process is effective in growing $SiO_2$ thin-films at temperatures lower than 400° C. at rates significantly higher than the thermal oxide rates, which are impractical below 800° C. As shown in FIG. 5, it is possible to obtain a growth rate of 100 Å/min after a deposition time of 10 min in He/$O_2$ atmosphere. The high-density plasma growth rates can be sustained down to an investigated temperature of about 150° C. The plasma grown oxide films show similar growth rates on <100> and <111> oriented silicon, which is desired for good step-coverage on different silicon faces. The oxygen radicals generated by the present invention process are active enough to diffuse through the 500 Å thick TEOS oxide film and improve its quality from the top surface to the Si/iO2 interface.

Step-Coverage and Oxide Quality Improvement

Figure 6:
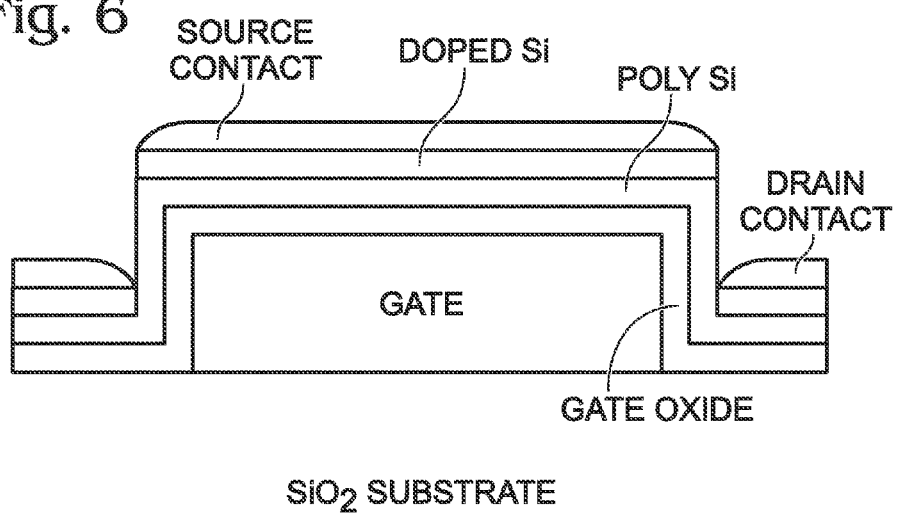
FIG. 6 is a partial cross-sectional view of an exemplary V-TFT.

FIG. 6 is a partial cross-sectional view of an exemplary V-TFT. The $SiO_2$ thin-films deposited by PECVD techniques, using TEOS precursors, are conventionally used in IC device fabrication due to high step-coverage and good electrical quality. For planar devices, the oxide quality is the most important consideration for device fabrication. Devices with graded and abrupt transitions or curved surfaces, where the electrical quality of the oxide thin-film is not critically important, can be processed using any oxide process that provides reasonable step-coverage. However, with devices like the V-TFT of FIG. 6, oxide thin-films are deposited on the side faces of the gate and used as the gate oxide. Hence, it is necessary to form the Si oxide using processes that offer high step-coverage as well as good electrical quality.

Figure 7:
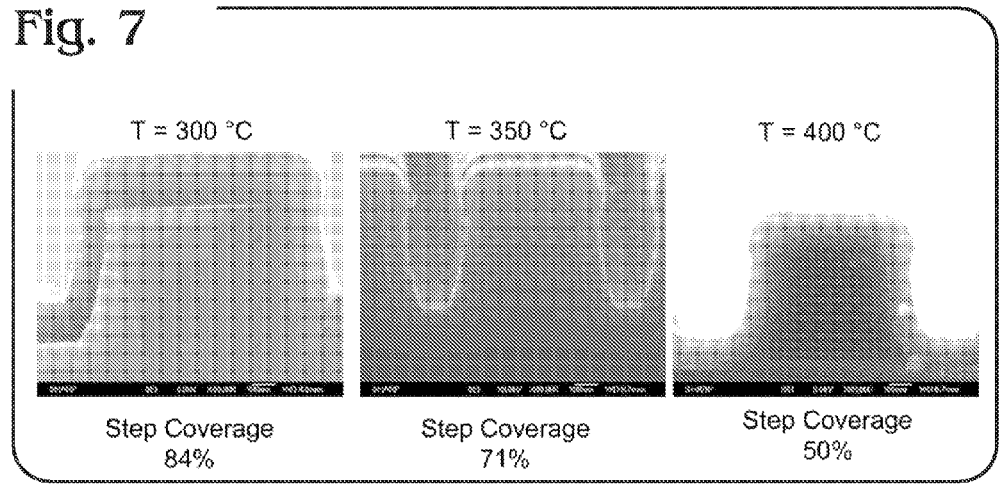
FIG. 7 depicts the step-coverage of 30 nm thick Si oxide thin-film deposited at different temperatures.

FIG. 7 depicts the step-coverage of 30 nm thick Si oxide thin-film deposited at different temperatures. TEOS oxide thin-films deposited at temperatures of 400° C., or greater, exhibit good electrical quality. However, the step-coverage is poor. The step-coverage of TEOS oxide thin-film improves as the process temperature is decreased from 400° C. As shown in FIG. 7, the step-coverage improves from 50 to 84% as the deposition temperature is decreased from 400 to 300° C. However, the electrical performance is found to degrade with decreasing temperature.

Figure 8:
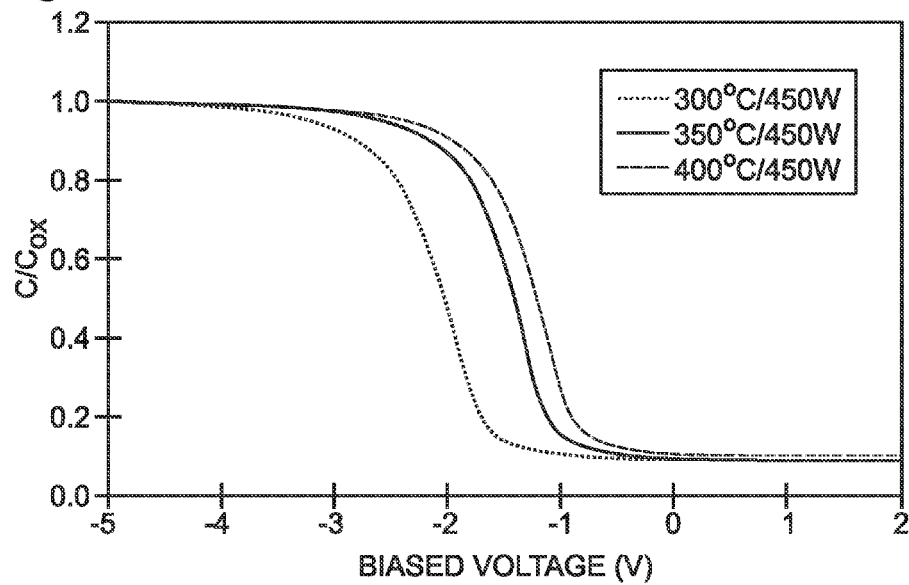
FIG. 8 is a graph depicting the effect of decreasing process temperature, with respect to the C-V response of TEOS oxide thin-films deposited by a standard PECVD process.

FIG. 8 is a graph depicting the effect of decreasing process temperature, with respect to the C-V response of TEOS oxide thin-films deposited by a standard PECVD process. As shown, the flat band voltage increases rapidly with a decrease in process temperature from 400 to 300° C. The lower electrical quality is likely due to increased impurity content and structural imperfections resulting from the use of lower temperatures.

Figure 9:
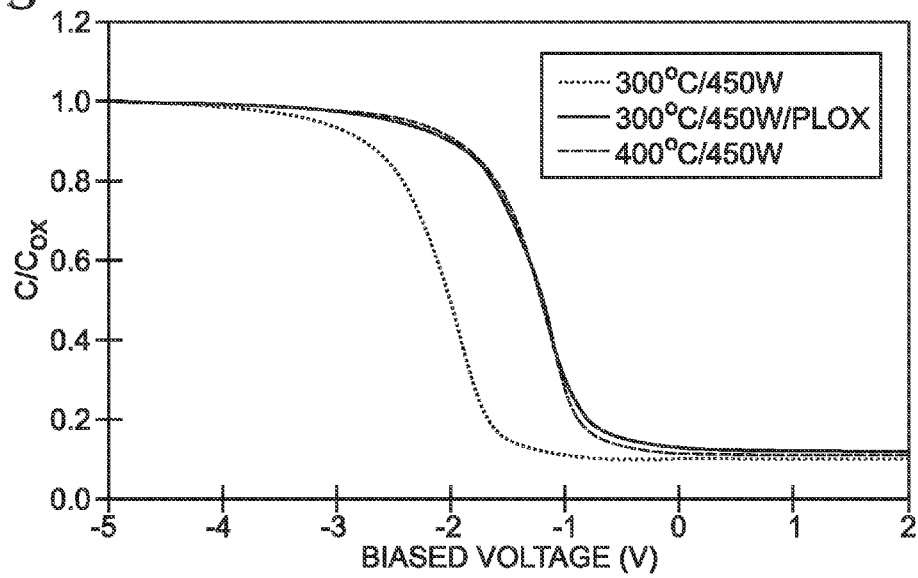
FIG. 9 is a graph depicting the effect of the post-deposition high-density oxygen plasma treatment on the C-V response of TEOS oxide film deposited at 300° C.

FIG. 9 is a graph depicting the effect of the post-deposition high-density oxygen plasma treatment on the C-V response of TEOS oxide film deposited at 300° C. The high-density plasma oxidation is carried out at 300° C. for 10 minutes. It is possible to improve the electrical quality of the TEOS oxide thin-films deposited at a temperature of 300° C. by post-deposition high-density plasma oxidation carried out at a temperature of about 300° C. for 10 minutes in He/$O_2$ atmosphere. As shown in FIG. 9, the flat band voltage of a TEOS oxide thin-film deposited at a temperature of 300° C. decreases significantly after post-deposition high-density plasma oxidation treatment at a temperature of 300° C. The C-V response of a TEOS oxide thin-film deposited at a temperature of 300° C. after plasma oxidation is comparable to a TEOS oxide film deposited at a temperature of 400° C. These results clearly demonstrate that a combination of the suitable high step-coverage oxide deposition process and post-deposition high-density plasma oxidation treatment can be effectively used for V-TFT or other device structures requiring the deposition of an oxide film with high step-coverage and high electrical performance.

The electrical parameter that is most sensitive to the deposition temperature is the flat band voltage. A higher flat band voltage reflects more fixed oxide charges in the film, and high oxide charges in the interface degrade TFT performance. A lower flat band voltage is desired to make high performance TFT devices. The high-density plasma oxidation process brings the flat band voltage to the levels obtained using a high temperature deposition process (400° C.).

The flat band voltage of a 50 nm thick SiO2 film (TEOS oxide) is below −2V after a plasma oxidation treatment. The flat band voltage of SiO2 (TEOS oxide) samples at thicknesses of less than 30 nm is below −1V after high-density plasma oxidation. Generally, flat band voltage depends on the type of oxide material and the metal/oxide work function difference.

FIGS. 8 and 9 show that the flat-band voltage becomes more negative as the process temperature is decreased from 400 to 300° C. If step-coverage is improved by decreasing the temperature, the electrical quality degrades (the flat-band voltage becomes more negative). FIG. 9 shows that the high-density plasma oxidation treatment significantly improves the electrical quality of the film deposited at a temperature of 300° C. As is clear from FIG. 9, the flat-band voltage of a film deposited at 300° C. and exposed to high-density oxygen plasma is comparable to a conventional film deposited at 400° C.

Generally, any kind of oxide deposition at a temperature of 400° C., or greater, produces an oxide of acceptable quality. However, for TEOS oxide the film properties change very rapidly with temperature and the typical processing temperature is 400° C., or lower. The quality of a TEOS oxide deposited at a temperature of 350° C. is still sufficiently good for some applications, but not as a gate oxide. However, the properties of TEOS oxide degrade rapidly at temperatures below 350° C.

For TEOS oxide films, an improvement in the flat band voltage and the bias temperature stress reliability can be obtained by practicing the present invention high-density plasma oxidation process. For oxide thin-films in general, the high-density plasma oxidation process yields improvement can be detected in the dielectric constant, flat band voltage, interface trap charges, leakage current, and breakdown field strength.

Alternately considered, the high-density plasma oxidation process decreases the concentration of oxide charges in the bulk of the dielectric film and at its top and bottom interfaces. The flat band voltage is dependent upon the effect of oxide charges. The flat band voltage value depends on the configuration (type of metal, type of Si), while the fixed charge concentration value does not depend on the configuration. So the fixed oxide charge concentration is a normalized parameter while flat band voltage is not. The oxide charges are typically confined to the Si/SiO2 interface but can also be located in the oxide film and the top metal/oxide interface. The term "oxide charges" has been used rather than "fixed oxide charges" as the contribution of all oxide charges is considered.

High-Density Plasma Oxidation of Oxides

The high-density plasma oxidation process described in this invention can be used for post-deposition oxygen plasma treatment of any oxide to improve its bulk and interfacial properties. The oxygen vacancies and defects are the major factors dictating the oxide quality and reliability for electronic devices. The high-density plasma oxidation process offers significantly lower thermal budgets for oxidation compared to standard oxidation approaches.

Process Range

TABLE 1

| | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Oxidation Time | 0-60 min |
| Gases | O$_2$/Inert Gas, O$_2$: 0-20% |
| Temperature | 25-400° C. |

High-density plasma oxidation processes for post-deposition oxidation treatment of oxide thin-films.

Generally, the present invention has been presented in the context of improving the quality of an oxide film, deposited at a low temperature, overlying a surface with an abrupt transition. However, the invention is also applicable to oxide grown on so-called planar surfaces. As the gate oxide thickness decreases below 50 nm, step-coverage becomes an issue even for the "planar" devices, as there are also steps in planar device surfaces. If deposition temperatures are reduced to improve the TEOS oxide step-coverage, then the principle of combining low temperature TEOS oxide+HDP (high-density plasma) oxidation becomes applicable to planar devices.

Figure 10:
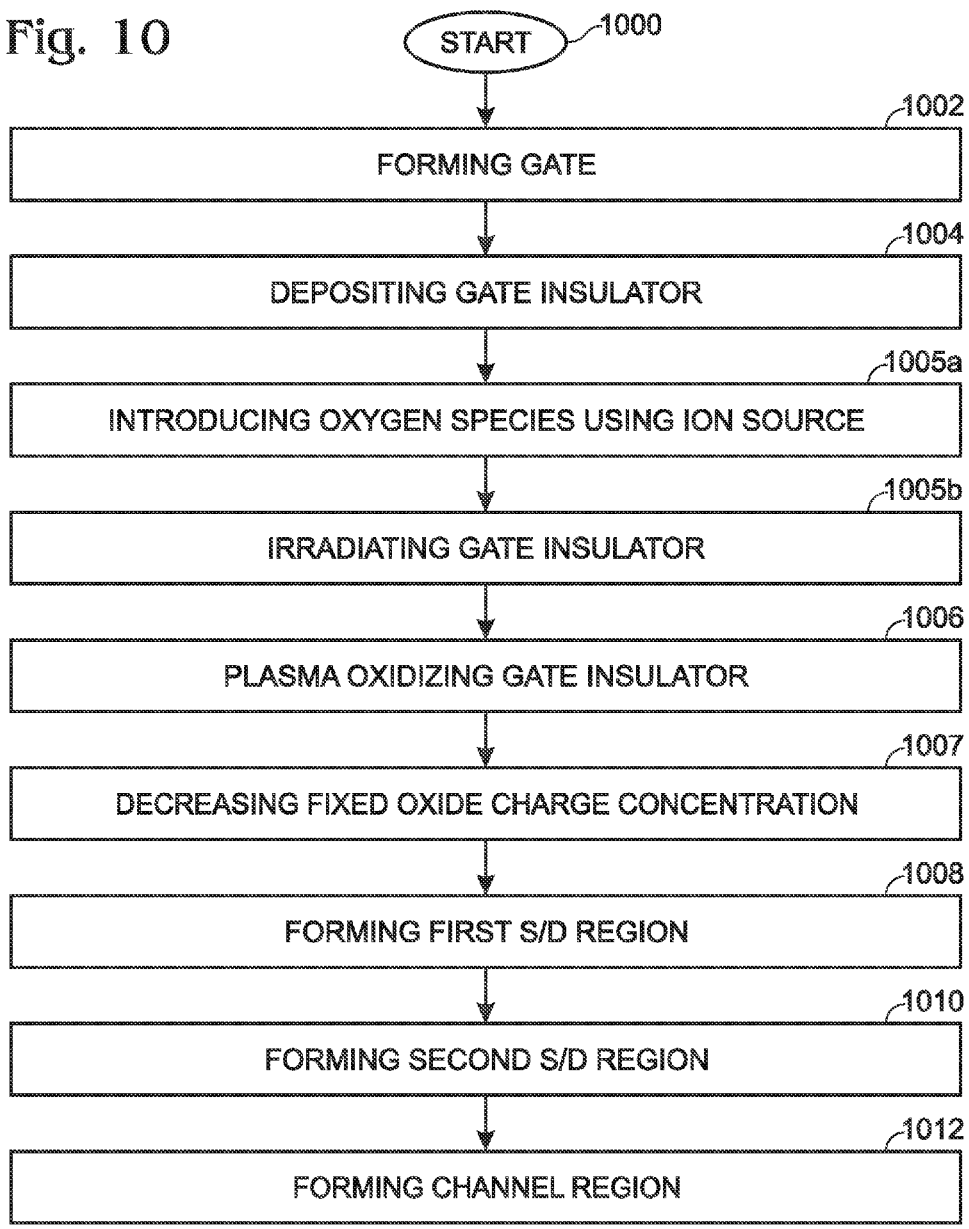
FIG. 10 is a flowchart illustrating a method for forming a low-temperature vertical gate insulator in a V-TFT fabrication process.

FIG. 10 is a flowchart illustrating a method for forming a low-temperature vertical gate insulator in a V-TFT fabrication process. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1000.

Step 1002 forms a gate, having vertical sidewalls and a top surface, overlying a substrate insulation layer. Step 1004 deposits a silicon oxide thin-film gate insulator overlying the gate. In some circumstances, Step 1004 deposits the silicon oxide at a temperature of less than 400 degrees C. Step 1006 plasma oxidizes the gate insulator at a temperature of less than 400° C., using a high-density plasma source. Step 1008 forms a first source/drain region overlying the gate top surface. Step 1010 forms a second source/drain region overlying the substrate insulation layer, adjacent a first gate sidewall. Step 1012 forms a channel region overlying the first gate sidewall, in the gate insulator interposed between the first and second source/drain regions.

In one aspect, depositing the silicon oxide thin-film gate insulator overlying the gate in Step 1004 includes forming a Si oxide layer having a step-coverage of greater than 65%, comparing the gate top surface to gate sidewalls. In another aspect, Step 1004 deposits a layer of Si oxide over the gate top surface having a thickness of less than 50 nm. In one other aspect, Step 1004 uses a plasma-enhanced chemical vapor deposition (PECVD) process with tetraethylorthosilicate (TEOS) precursors to deposit the Si oxide.

In one aspect, plasma oxidizing the gate insulator in Step 1006 includes using an inductively coupled plasma (ICP)

source with the following substeps (not shown), see Table 1 above. Step 1006a supplies power to a top electrode at a frequency in the range of 13.56 to 300 MHz, and a power density of up to 10 W/cm$^2$. Step 1006b supplies power to a bottom electrode at a frequency in the range of 50 kilohertz to 13.56 MHz, and a power density of up to 3 W/cm$^2$. Step 1006c uses an atmosphere pressure in the range of 1 to 500 mTorr. Step 1006d supplies an oxygen gas.

In one aspect, supplying an oxygen gas in Step 1006d includes: mixing $O_2$ and an insert gas in a ratio in the range of 0 to 20%; and, using an inert gas such as He, Ar, or Kr. Then, the method further comprises Step 1006e, which oxidizes for a duration in the range of 1 to 60 minutes. Alternately, Step 1006d includes supplying oxygen gas from a source such as $N_2O$, $O_2$, or $O_3$.

In one aspect of the method, Step 1007 decreases the concentration of oxide charge in the gate insulation layer. For example, if Step 1004 deposits a layer of Si oxide over the gate top surface having a thickness in the range of about 10 to 50 nm, then Step forms an oxide charge concentration of less than $5 \times 10^{11}$ cm$^{-2}$.

In a different aspect, Step 1005a introduces an oxygen species using an ion source, simultaneous with the plasma oxidation of Step 1006. That is, plasma oxidizing the gate insulator at a temperature of less than 400° C. in Step 1006 includes plasma oxidizing the gate insulator at least partially in response to the oxygen species. In one aspect, Step 1005a controls the energy of the oxygen species impinging on the gate insulator in response to the low frequency bias applied to the bottom electrode (Step 1006b).

In another aspect, Step 1005b irradiates the gate insulator with an energy source such as a light source or a laser beam, simultaneous with the plasma oxidation of Step 1006. That is, plasma oxidizing the gate insulator at a temperature of less than 400° C. in Step 1006 includes plasma oxidizing the gate insulator at least partially in response to the energy source of Step 1005b.

Figure 11:
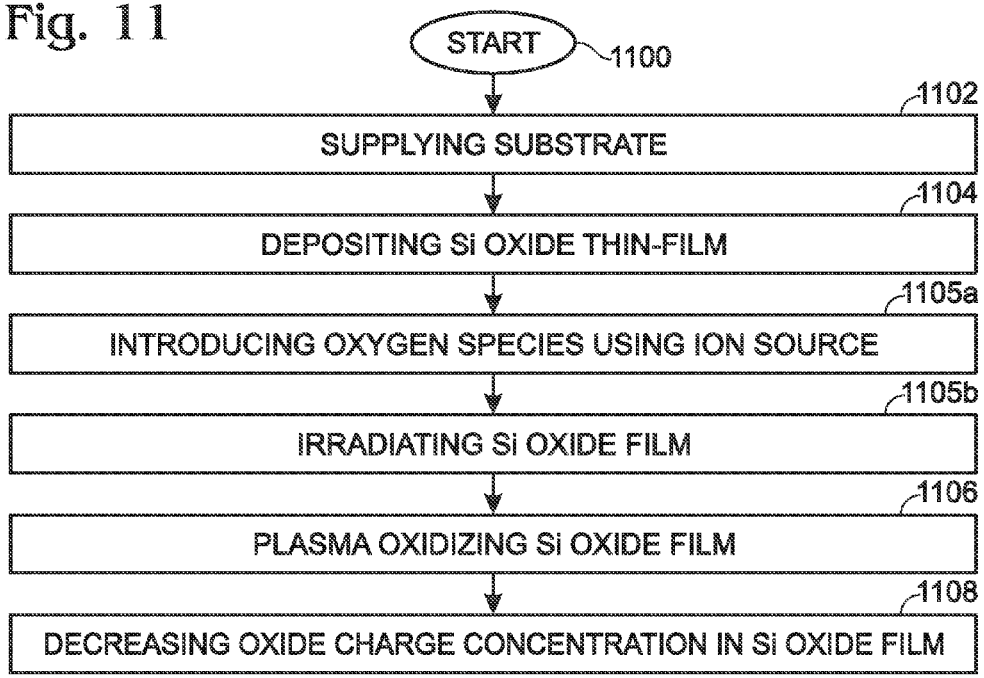
FIG. 11 is a flowchart illustrating a method for forming a silicon oxide film overlying a substrate having an abrupt transition in an integrated circuit (IC) fabrication process.

FIG. 11 is a flowchart illustrating a method for forming a silicon oxide film overlying a substrate having an abrupt transition in an integrated circuit (IC) fabrication process. The method starts at Step 1100. Step 1102 supplies a substrate, made from a material such as Si, silicon oxide, or transparent materials such as glass, plastic, or quartz, having a surface with an abrupt transition. For example, the abrupt transition surface can be a stepped, graded, or curved surface. Step 1104 deposits a silicon oxide thin-film overlying the substrate surface having a step-coverage of greater than 65%. In some aspects, the silicon oxide thin-film is deposited at a temperature of less than 400 degrees C. Step 1006 plasma oxidizes the silicon oxide thin-film at a temperature of less than 400° C., using a high-density plasma source. Step 1008 decreases the concentration of oxide charge in the silicon oxide thin-film. For example, a silicon oxide film with an oxide charge concentration of less than $5 \times 10^{11}$ cm$^{-2}$ can be formed.

In one aspect, depositing the Si oxide thin-film gate insulator in Step 1004 includes depositing a layer of Si oxide over the substrate surface having a thickness of less than 50 nm. In another aspect, the Si oxide is deposited using a PECVD process with TEOS precursors.

In one aspect, plasma oxidizing the silicon oxide thin-film in Step 1006 includes using an ICP source as follows: supplying power to a top electrode at a frequency in the range of 13.56 to 300 MHz, and a power density of up to 10 W/cm$^2$; supplying power to a bottom electrode at a frequency in the range of 50 kilohertz to 13.56 MHz, and a power density of up to 3 W/cm$^2$; using an atmosphere pressure in the range of 1 to 500 mTorr; and, supplying an oxygen gas.

The oxygen gas can be $O_2$ mixed with an insert gas in a ratio in the range of 0 to 20%. The inert gas can be He, Ar, or Kr. Then, the plasma oxidation process further comprises oxidizing for a duration in the range of 1 to 60 minutes. Alternately, the oxygen gas can be $N_2O$, $O_2$, or $O_3$.

In a different aspect, Step 1105a introduces an oxygen species using an ion source, simultaneous with the plasma oxidation of Step 1106. That is, plasma oxidizing the Si oxide thin-film at a temperature of less than 400° C. in Step 1106 includes plasma oxidizing the Si oxide at least partially in response to the oxygen species. In one aspect, Step 1105a controls the energy of the oxygen species impinging on the Si oxide thin-film in response to the low frequency bias applied to the bottom electrode.

In another aspect, Step 1105b irradiates the Si oxide thin-film with an energy source such as a light source or a laser beam, simultaneous with the plasma oxidation of Step 1106. That is, plasma oxidizing the Si oxide thin-film in Step 1106 includes plasma oxidizing the Si oxide film at least partially in response to the energy source of Step 1105b.

A high-density plasma oxidation method has been presented along with some oxide-covered structures that benefit from this process. Some details of specific materials and fabrication steps have been used to illustrate the invention. However, the invention is not limited to merely these examples. Other variations and embodiments of the invention will occur to those skilled in the art.

We claim:

1. A vertical thin-film transistor (V-TFT) device comprising:
    a substrate;
    a substrate insulation layer overlying the substrate;
    a gate, having vertical sidewalls and a top surface, overlying the substrate insulation layer;
    a silicon oxide thin-film gate insulator overlying the gate top surface and sidewalls having a step-coverage of greater than 65%;
    a first source/drain region overlying the gate top surface;
    a second source/drain region overlying the substrate insulation layer, adjacent a first gate sidewall; and
    a single channel region overlying the first gate sidewall, interposed between the first and second source/drain regions.

2. The device of claim 1 wherein the substrate is a material selected from the group including glass, silicon, quartz, and plastic.

3. A vertical thin-film transistor (V-TFT) device comprising:
    a substrate;
    a substrate insulation layer overlying the substrate;
    a gate, having vertical sidewalls and a top surface, overlying the substrate insulation layer;
    a silicon oxide thin-film gate insulator overlying the gate top surface and sidewalls having a thickness in the range of about 10 to 50 nanometers (nm) and an oxide charge concentration of less than $5 \times 10^{11}$ per square centimeter (cm$^{-2}$);
    a first source/drain region overlying the gate top surface;
    a second source/drain region overlying the substrate insulation layer, adjacent a first gate sidewall; and
    a single channel region overlying the first gate sidewall, interposed between the first and second source/drain regions.

4. The device of claim 3 wherein the substrate is a material selected from the group including glass, quartz, silicon, and plastic.

5. A silicon oxide thin-film structure formed an abrupt transition surface, the structure comprising:
   a substrate having a surface with an abrupt transition;
   a silicon oxide thin-film overlying the surface having a thickness in the range of about 10 to 50 nanometers (nm), an oxide charge concentration of less than $5 \times 10^{11}$ per square centimeter ($cm^{-2}$), and a step-coverage of greater than 65%.

6. The structure of claim 5 wherein the substrate abrupt transition surface is selected from the group comprising stepped, graded, and curved.

7. The structure of claim 5 wherein the substrate is a material selected from the group including silicon, glass, plastic, and quartz.

* * * * *